US010804840B2

(12) United States Patent
Wouters et al.

(10) Patent No.: US 10,804,840 B2
(45) Date of Patent: Oct. 13, 2020

(54) ELECTRICAL CONNECTION DEVICE FOR A PHOTOVOLTAIC SYSTEM

(71) Applicant: ArcelorMittal, Luxembourg (LU)

(72) Inventors: Paul Wouters, Liege (BE); Lionel Fourdrinier, Saint-Gilles (BE); Eftychios Xirakis, Schaerbeek (BE); Renaud Vignal, Sevrier (FR); Andreas Torma, Allschwil (CH)

(73) Assignee: ARCELORMITTAL, Luxembourg (LU)

( * ) Notice: Subject to any disclaimer, the term of this patent is extended or adjusted under 35 U.S.C. 154(b) by 0 days.

(21) Appl. No.: 16/464,649

(22) PCT Filed: Nov. 30, 2017

(86) PCT No.: PCT/IB2017/001475
§ 371 (c)(1),
(2) Date: May 28, 2019

(87) PCT Pub. No.: WO2018/100425
PCT Pub. Date: Jun. 7, 2018

(65) Prior Publication Data
US 2019/0386609 A1 Dec. 19, 2019

(30) Foreign Application Priority Data
Nov. 30, 2016 (WO) ............... PCT/IB2016/057222

(51) Int. Cl.
H02S 40/34 (2014.01)
H02S 30/10 (2014.01)
(Continued)

(52) U.S. Cl.
CPC .............. H02S 40/34 (2014.12); F24S 25/61 (2018.05); H01L 31/02008 (2013.01);
(Continued)

(58) Field of Classification Search
CPC .......... H02S 40/34; H02S 40/36; H02S 20/25; H02S 30/10; F24S 25/61; H01L 31/02008; H01R 13/46; H02G 3/08
See application file for complete search history.

(56) References Cited

U.S. PATENT DOCUMENTS 5,334,032 A * 8/1994 Myers ................ H01R 13/5219
439/140
5,914,665 A * 6/1999 Thorp ................... G08B 7/062
174/488
(Continued)

FOREIGN PATENT DOCUMENTS

EP 2216829 A1 11/2010
FR 2914785 A1 10/2008
(Continued)

OTHER PUBLICATIONS

The International Search Report issued in connection with International application No. PCT/IB2016/057222 dated Jul. 8, 2017.
(Continued)

Primary Examiner — Jayne L Mershon
(74) Attorney, Agent, or Firm — Davidson, Davidson & Kappel, LLC

(57) ABSTRACT

The present invention provides an electrical connection box for a panel of exterior cladding of a building equipped with at least one photovoltaic module including an electrical pole at one of its longitudinal extremities and an electrical pole of inverse polarity at the other extremity, the connection box including a first shell and a second shell which are interlockable, the first shell including a base including an aperture topped by a sealing chamber, a lateral wall surrounding the base and extending perpendicularly to it, the lateral wall including a removable hatch used as a wire passage, an electrical terminal attached perpendicularly to the base, the second shell including a base, a lateral wall surrounding the
(Continued)

base and extending perpendicularly to it, the lateral wall including a wire passage, an electrical terminal of inverse polarity to that of the electrical terminal of the first shell, the electrical terminal being on a perpendicular axis to the base, attached to the base and positioned in such a way that it is plumb with the electrical terminal of the first shell when the first and the second shell are interlocked.

The invention further provides a panel of exterior cladding of a building equipped with connection boxes according to the present invention, to the related roof, to the related connection kit and to the related electrical device.

7 Claims, 10 Drawing Sheets

(51) Int. Cl.
  *H02S 20/25* (2014.01)
  *H02S 40/36* (2014.01)
  *H02G 3/08* (2006.01)
  *H01R 13/46* (2006.01)
  *F24S 25/61* (2018.01)
  *H01L 31/02* (2006.01)

(56) References Cited

U.S. PATENT DOCUMENTS

| | | | | |
|---|---|---|---|---|
| 8,759,676 | B1* | 6/2014 | Gretz | H02G 3/185 174/50 |
| 2010/0018572 | A1 | 1/2010 | Grimberg et al. | |
| 2010/0180523 | A1 | 7/2010 | Lena et al. | |
| 2010/0263714 | A1* | 10/2010 | Lauermann | H02S 40/34 136/251 |
| 2012/0151856 | A1* | 6/2012 | Azoulay | H02S 20/25 52/173.3 |
| 2015/0349505 | A1* | 12/2015 | Yamazaki | H02G 3/22 174/650 |
| 2016/0118933 | A1* | 4/2016 | Russell | H02S 40/32 136/251 |
| 2016/0204293 | A1 | 7/2016 | Miyuki et al. | |

FOREIGN PATENT DOCUMENTS

| | | |
|---|---|---|
| FR | 2947099 A1 | 12/2010 |
| JP | H10102708 A | 4/1998 |
| JP | 2012530201 A | 11/2012 |
| RU | 2313642 C1 | 12/2007 |
| WO | 2008000101 A1 | 1/2008 |
| WO | 2009090347 A2 | 7/2009 |
| WO | 2010019749 A2 | 2/2010 |

OTHER PUBLICATIONS

The International Search Report issued in connection with International application No. PCT/IB2017/001475 dated Jul. 3, 2018.
The International Preliminary Search Report issued in connection with International application No. PCT/IB2017/001475 dated Feb. 2, 2019.

* cited by examiner

ELECTRICAL CONNECTION DEVICE FOR A PHOTOVOLTAIC SYSTEM

FIELD OF THE INVENTION

The present invention relates to an electrical connection box for exterior cladding panels of a building equipped with at least one photovoltaic module. A panel of this type is intended mainly for the construction of photovoltaic roofs, without being limited to this application.

BACKGROUND

The use of ribbed panels as a roof covering, for example, made of galvanized, pre-coated steel, of which the edges overlap to ensure the water-tightness of the roof, is known.

It is furthermore known, in particular from WO2009090347, to install photovoltaic modules on the cladding of buildings. These modules may be in the form of flexible ribbons glued to the surface of the troughs of the ribbed panels. In the future, they may also be photovoltaic devices deposited directly on the surface of the troughs of the ribbed panel, in particular by using vacuum deposition or atmospheric pressure deposition methods. These modules are connected to one another by a network of wires, the majority of which, in certain embodiments, are situated on the rear side of the covering in order to avoid premature damage to the wires and in order to preserve the aesthetics of the building.

Such an array nevertheless has the disadvantage that access to the roof sub-structure is required in order to carry out the connection on the rear side of the ribbed panels of two adjacent modules.

It is known from JP10102708 to avoid the use of wires by using a male electrical connector situated in the vicinity of the lower extremity of the panel on the rear side, and a female electrical connector situated in the vicinity of the upper extremity of the panel on the top surface. During assembly of two longitudinally adjacent roofing panels, the male electrical connector of the upper panel is inserted into the female electrical connector of the lower panel which electrically connects the photovoltaic module of the upper panel to the photovoltaic module of the lower panel.

Such an arrangement nevertheless does not allow easy adjustment of the wiring diagram of the photovoltaic installation so that the wiring outlets toward the converter are located at the ridge of the roof. This type of connection requires the use of two types of roofing panels which differ from one another by an inverted placement of the photovoltaic cells and by different male/female connectors. The first panel type is used to implement a first column of electrically connected photovoltaic modules from the ridge of the roof to the base of the slope. The second panel type is used to implement a second column of electrically connected photovoltaic modules from the bottom of the slope to the ridge of the roof, this column being adjacent to the first. The electrical connection between the two columns and the converter then requires multiple types of electrical connections as a function of the male and female connectors to be connected. The multiple elements required to install such a roof present a substantial obstacle to its acceptance by roof installers.

SUMMARY OF THE INVENTION

An object of various embodiments of the present invention is to remedy the problems described above by providing an electrical connection box and a related panel which facilitate the assembly of panels and the wiring of the photovoltaic modules.

The present invention provides a panel of the exterior cladding of a building including:
- an upper transverse edge including an upper overlap area intended to be overlapped by an adjacent panel,
- a lower transverse edge including a lower overlap area intended to overlap an adjacent panel,
- a central part, which connects the transverse edges, which is covered by at least one pair of columns of photovoltaic modules, each column including one electrical pole at one of its longitudinal extremities and one electrical pole of inverse polarity at the other extremity, the poles of the two adjacent columns being of inverse polarity,
- a perforation situated in the lower overlap area through which a conducting strip is passed, which connects one of the two electrical poles of the column of photovoltaic modules to one of the two shells of a connection box, this shell being situated on the rear side of the panel in the lower overlap area,
- an indentation, situated in the upper overlap area in which the other of the two shells of the connection boxes is placed, this shell being connected to the other electrical pole of the column of photovoltaic modules, the connection box including a first shell and a second shell, one interlockable inside the other,
- the first shell including:
  - a base including one aperture topped by a sealing chamber,
  - a lateral wall surrounding the base and extending perpendicularly to it, the lateral wall including a removable hatch used as a wire passage,
  - an electrical terminal connected to the base, with an axis perpendicular to the base,
- the second shell including:
  - a base,
  - a lateral wall surrounding the base and extending perpendicularly to it, the lateral wall including a wire passage,
  - an electrical terminal of inverse polarity to that of the electrical terminal of the first shell, the electrical terminal having an axis perpendicular to the base, connected to the base and positioned in such a way that it is plumb with the electrical terminal of the first shell when the first and the second shell are interlocked.

In some embodiments, the panel according to the present invention may also include one or more of the following characteristics:
- the electrical terminal is electrically connected to the sealing chamber,
- the first shell is positioned on the rear side of the panel in the lower overlap area and the second shell is positioned in the indentation,
- the first shell is positioned plumb with the perforation,
- the second shell is positioned on the rear side of the panel in the lower overlap area while the first shell is positioned in the indentation,
- the second shell is connected to an electrical pole of the column of photovoltaic modules with the aid of an electrical wire and a junction box,
- the two shells are positioned at the same distance from the first longitudinal edge, and the distance between the first shell and the lower transverse edge of the panel is identical to the distance between the second shell and the lower edge of the upper overlap area.

The present invention also provides a roof with an assembly by marginally overlapping at least two panels according to the present invention.

The present invention further provides an electrical connection box for a panel of the exterior cladding of a building equipped with at least one photovoltaic module including an electrical pole at one of its longitudinal extremities and an electrical pole of inverse polarity at the other extremity, the connection box including a first shell and a second shell which are interlockable, the first shell including:
- a base including one aperture topped by a sealing chamber,
- a lateral wall surrounding the base and extending perpendicularly to it, the lateral wall including a removable hatch used as a wire passage,
- an electrical terminal connected to the base, with an axis perpendicular to the base, the second shell including:
- a base,
- a lateral wall surrounding the base and extending perpendicularly to it, the lateral wall including a wire passage,
- an electrical terminal of inverse polarity to that of the electrical terminal of the first shell, the electrical terminal having an axis perpendicular to the base, connected to the base and positioned in such a way that it is plumb with the electrical terminal of the first shell when the first and the second shell are interlocked.

In some embodiments, the connection box according to the present invention may also include one or more of the following characteristics:
- the base of the first shell includes no opening other than the aperture,
- the sealing chamber of the first shell includes one dividing wall having a closed outline, placed on the base, extending therefrom and surrounding the aperture,
- the sealing chamber is topped by a lid,
- the electrical terminal of the first shell includes a conductive contact extending into the sealing chamber,
- the electrical terminal of the first shell is topped by a protective cover,
- one of the electrical terminals includes a cylindrical conductive pin topped by an insulating tip,
- the lateral walls of the two shells have a circular cross-section,
- the removable hatch is a sealing plug positioned inside an opening in the thickness of the lateral wall,
- the electrical terminal of one of the two shells includes a vertical tube and conductive strips placed along the inner wall of the tube which extend along the axis of the tube,
- the perimeter of the lateral wall of the first shell is smaller than the perimeter of the lateral wall of the second shell so that the lateral wall at least partially inserts into the second shell, by moving in parallel to the inner surface of the lateral wall of that shell,
- the lateral wall of one of the two shells includes a peripheral seal situated on the external surface thereof,
- the lateral wall of one of the two shells includes mounting clips,
- the lateral wall of the first shell includes a cutaway and the lateral wall of the second shell includes a cutaway,
- the cutaway of the lateral wall and the removable hatch of the first shell are offset angularly by an angle α while the wire passage and the cutaway of the second shell are offset angularly by the same angle α,
- one of the two shells includes a peripheral ledge on the external surface of its lateral wall.

The present invention also provides a kit for the connection, to a converter, of panels provided with a photovoltaic device composed of an even number of columns of photovoltaic modules, each column including an electrical pole at one of its longitudinal extremities and an electrical pole of inverse polarity at the other extremity, the poles of two adjacent columns being of inverse polarity, the kit including:
- an electrical connection box according to the invention,
- an electrical wire provided at its two extremities with a second connection box shell according to the present invention, each extremity of the electrical wire being inserted in the wire passage of that shell,
- a first connection box shell according to the present invention provided with an electrical wire inserted in the removable hatch used as a wire passage of that shell.

The invention also provides a kit for the connection, to a converter, of panels equipped with a photovoltaic device composed of an even number of columns of photovoltaic modules, each column including an electrical pole at one of its longitudinal extremities and an electrical pole of inverse polarity at the other extremity, the poles of two adjacent columns being of inverse polarity, the kit including:
- an electrical connection box according to the present invention,
- an electrical wire provided at its two extremities with a first connection box shell according to the present invention, each extremity of the electrical wire being inserted in the removable hatch used as a wire passage of that shell,
- a second connection box shell according to the present invention provided with an electrical wire inserted in the wire passage of that shell.

The invention further provides an electrical device that may be connected to a converter including an assembly of panels inclined along a given slope and including:
- an upper transverse edge including an upper overlap area intended to be overlapped by an adjacent panel,
- a lower transverse edge including a lower overlap area intended to overlap an adjacent panel,
- a photovoltaic device including an even number of columns of photovoltaic modules, each column including an electrical pole at each of its extremities, the polarity of an electrical pole of one extremity being the inverse of that of the electrical pole of the other extremity, the poles of two adjacent columns being of inverse polarity,
- the electrical pole of the lower extremity of each column being in the form of a first connection box shell according to the invention positioned on the rear side of the panel in the lower overlap area,
- the electrical pole of the upper extremity of each column being in the form of a second connection box shell according to the invention positioned on the top surface of the panel in the upper overlap area,
- the panels being juxtaposed by marginal overlapping of their longitudinal edges and/or their transverse edges to form rows of photovoltaic modules in the direction of the slope, the assembly being such that:
  - in the marginal overlap of two adjacent panels of a given row, the first shell of the lower extremity of each column of the upper panel is interlocked with or onto the second shell of the upper extremity of the facing column on the lower panel, at the bottom of the slope of the assembly, the first shell of the lower extremity of the first row is electrically connected to the first shell of the lower extremity of the second row and so on, the connection between the two rows being carried out with the aid of a transverse connector including two second shells connected by an electrical wire, at the ridge, the second shells of the upper extremities of the rows are connected to the converter with the aid of one first shell equipped with an electrical wire inserted into the removable hatch, or with each other in a method similar to the one performed at the bottom of the slope with the aid of a transverse connector including two first shells connected by an electrical wire.

As shown in the above, in certain embodiments, the invention is based on the usage of two shells, which are interlockable, designed to allow the implementation of all electrical connections of the photovoltaic exterior cladding of a building by using only those two shells which allow both the electrical connection of the two panels to one another, the electrical connection of the photovoltaic modules at the bottom of the slope, with each other or to the converter, and the electrical connection of the photovoltaic modules at the ridge with each other or to the converter.

Other characteristics and advantages of the invention are described in greater detail below.

In order to illustrate the invention, tests were carried out and will be described by way of non-restricting examples, in particular with reference to the figures which represent.

BRIEF DESCRIPTION OF THE DRAWINGS

The invention will be better understood from a reading of the following description, which is intended to be explanatory but not restrictive, with reference to the accompanying figures which represent.

The same reference numbers represent the same elements in each of the figures.

DETAILED DESCRIPTION

Figure 1:
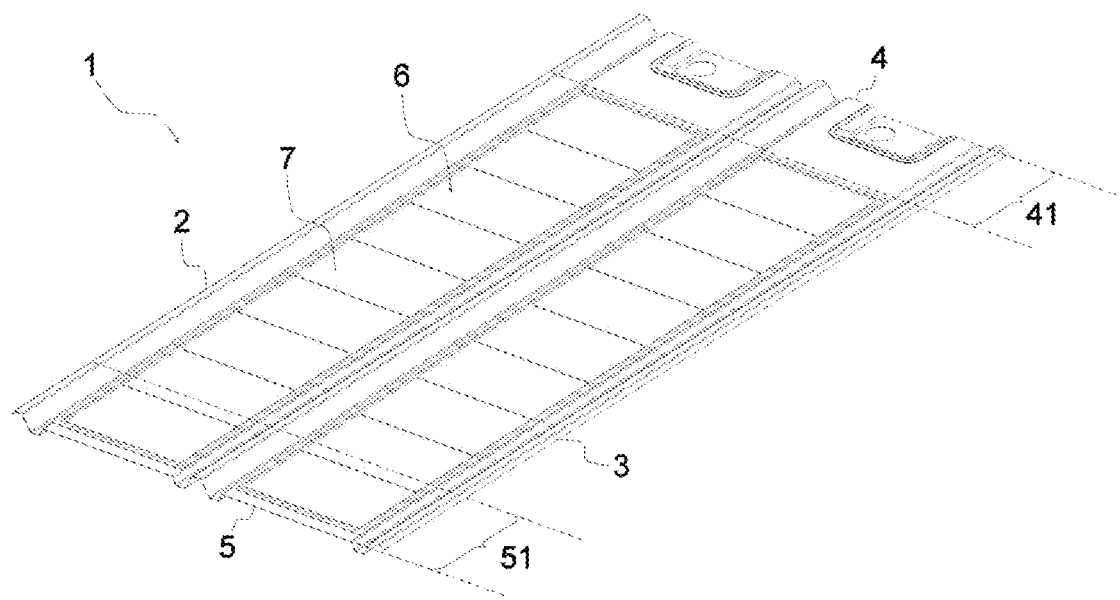
FIG. 1 shows a perspective view of a panel of an exterior cladding of a building equipped with at least one photovoltaic module.

Throughout the text, a panel is understood to mean an element that has a flat shape, i.e., its thickness is low compared to its other dimensions. The panel may be in the form of a plate or sheet made of a single material or a composite assembly. In the latter case, the panel is a stack of a plurality of layers of the same material or different materials. The material in question may be, among other things, a metallic material, a polymer or even a ceramic. Steel, aluminum, copper and zinc may be cited as non-restricting examples of metallic materials. In certain embodiments, the panel is a metallic sheet. In some of these embodiments, the panel is made of previously galvanized and pre-coated steel to protect it against corrosion. The panel may optionally be foamed on its bottom surface and thereby constitute the exterior facing of a sandwich panel.

In accordance with an embodiment of the present invention, the panel has been previously formed with the aid of any known forming method, including, by way of non-restricting examples, bending, forming, stamping and molding. The panel is then said to be shaped.

This forming leads among other things to the formation of ribs on the surface of the panel. Throughout the text, a rib is understood to mean a projection formed on the surface of the panel. The rib may have a trapezoidal shape, as in the case of the exemplary embodiments described below, or a rectangular, corrugated, sinusoidal or even omega shape, for example. It includes a top central part and two lateral wings. Ribs are generally placed in parallel to the longitudinal edges of the panel, in particular to facilitate assembly of the adjacent panel, to achieve a good water-tightness of the assembly or in order to render the panel more rigid.

To form an exterior cladding of a building, such as a roof or a facade, the panels are assembled with a marginal overlapping of their longitudinal edges and their transverse edges and are affixed to the supporting structure of the building by fastening means such as screws, nails or rivets.

For better understanding of the invention, in the following description reference is only made to a roof, but the invention may also be used for all other exterior cladding of a building and, as such, positioned and/or inclined in various ways.

Therefore, the terms "under", "over", "below", "on", "beneath", "upper", "lower", . . . refer to a position of an element of the invention in relation to another element when the panel and/or the connection box according to the present invention are positioned on a roof.

Throughout the text, a photovoltaic module is understood to mean an assembly that is capable of converting solar energy into electricity, and is delimited by a protective barrier that isolates electrically interconnected photovoltaic cells from the exterior. By way of non-restricting example, it may be a module in the form of a flexible ribbon glued to the central part of the panel or a module deposited directly on the central part of the panel by successive deposition of layers of an appropriate type using vacuum deposition or atmospheric pressure deposition methods.

Within each photovoltaic module, the placement and the organization of these photovoltaic cells is not limiting. By way of a non-restricting example, the cells may be located one below another in a single row or may be arranged in a plurality of rows, the rows being connected to one another to form a sort of folded ribbon. In certain embodiments, to facilitate the deposition of photovoltaic modules directly on a continuously-running steel strip using vacuum deposition or atmospheric pressure deposition methods, the cells are arranged in a single row.

Within the framework of the invention, the photovoltaic module includes an electrical pole at one of its longitudinal extremities and an electrical pole of inverse polarity at the other extremity. These electrical poles are by default in the form of a conducting strip ("ribbon") connected to the photovoltaic cell at the extremity of the module. Within the framework of the invention, the cross-section and the form of the conducting strip may vary. The electric poles may also take other forms.

Throughout the text, a column of photovoltaic modules is understood to mean the entirety of the photovoltaic modules placed end to end along the length of a panel. A column of photovoltaic modules may thus be reduced to one photovoltaic module or may be made up of a plurality of photovoltaic modules placed end to end. Two successive photovoltaic modules are placed end to end by establishing electrical contact between the last photovoltaic cell of one module and the first photovoltaic cell of the other module so that the two cells are connected in series.

Within the framework of the invention, each column includes an electrical pole at one of its longitudinal extremities and an electrical pole of inverse polarity at the other extremity. In other words, each column includes, at its lower extremity, an electrical pole which merges with the electrical pole of the lower extremity of the first module of this column, and on its upper extremity an electrical pole of inverse polarity that merges with the electrical pole of the upper extremity of the last module of that column.

With reference to FIG. 1, panel 1 of the exterior cladding of a building is in general formed by a first longitudinal edge 2, a second longitudinal edge 3, an upper transverse edge 4, a lower transverse edge 5, the four edges being connected by a central part 6, covered by at least one pair of columns 7 of photovoltaic modules (for example, as shown here, two columns of a module made up of nine photovoltaic cells.)

Upper transverse edge 4 includes an upper overlap area 41 intended to be overlapped by an adjacent panel during assembly of the roof. This upper overlap area generally has a width between 150 mm and 500 mm as a function of, among other things, the slope of the roof.

Lower transverse edge 5 includes a lower overlap area 51 intended to overlap an adjacent panel during assembly of the roof. This lower overlap area generally has a width between 150 mm and 500 mm as a function of, among other things, the slope of the roof.

In certain embodiments, the first longitudinal edge 2 includes a first longitudinal rib including a rib apex and two lateral wings extending from the top of the rib on each side of the rib and downwards. Its main function is to ensure that the panel is secured to the building structure at the top of the panel corrugation and not at the trough of the panel corrugation. This prevents water from stagnating in the vicinity of the fasteners and thus prevents any possible roof seal failure.

In this embodiment, the top of the rib is flat and the lateral wings are inclined, extending downwards and outwards from the top of the rib. According to the present invention, the first longitudinal rib can, of course, have shapes other than the one described in this embodiment.

In certain embodiments, the second longitudinal edge 3 includes a second longitudinal rib including a rib apex and two lateral wings extending from the top of the rib on each side of the top of the rib and downwards, and it is intended to be overlapped by the first longitudinal rib of the adjacent panel when two panels are assembled. The shapes of the first and second longitudinal ribs should be adjusted accordingly.

In certain embodiments, the shapes are adjusted so that water-tightness is ensured when roof panels are used. In certain embodiments, the two ribs are of substantially the same shape and size so that the overlap is a perfect joint and, therefore, completely watertight. However, according to the present invention, the overlap may be joined only locally. A person skilled in the art who is conversant with these sealing issues will be able to adjust the shapes of the two longitudinal ribs according to the desired aesthetics while ensuring that the assembly is watertight.

In certain embodiments, the columns of the photovoltaic modules are aligned essentially in parallel to a longitudinal edge of the panel, in order to take advantage of the shape of the panel and thus, limit the number of columns, which in turn makes it possible to limit the number of connection boxes required for their connection. In certain embodiments, the columns are of identical length and their extremities are aligned essentially in parallel to a transverse edge of the panel to facilitate the connection of the columns of two adjacent panels.

In certain embodiments, in order to facilitate the wiring of an assembly of panels, as will be described below, the poles of the two adjacent columns are of inverse polarity.

In certain embodiments, the columns of a panel are not electrically connected to one another. The electrical connection between the columns will be made only after the assembly of the panels, as will be described below. This simplifies the fabrication of the panel in the factory and makes it possible to adapt the wiring to the specificities of the assembly on the construction site.

Figure 2:
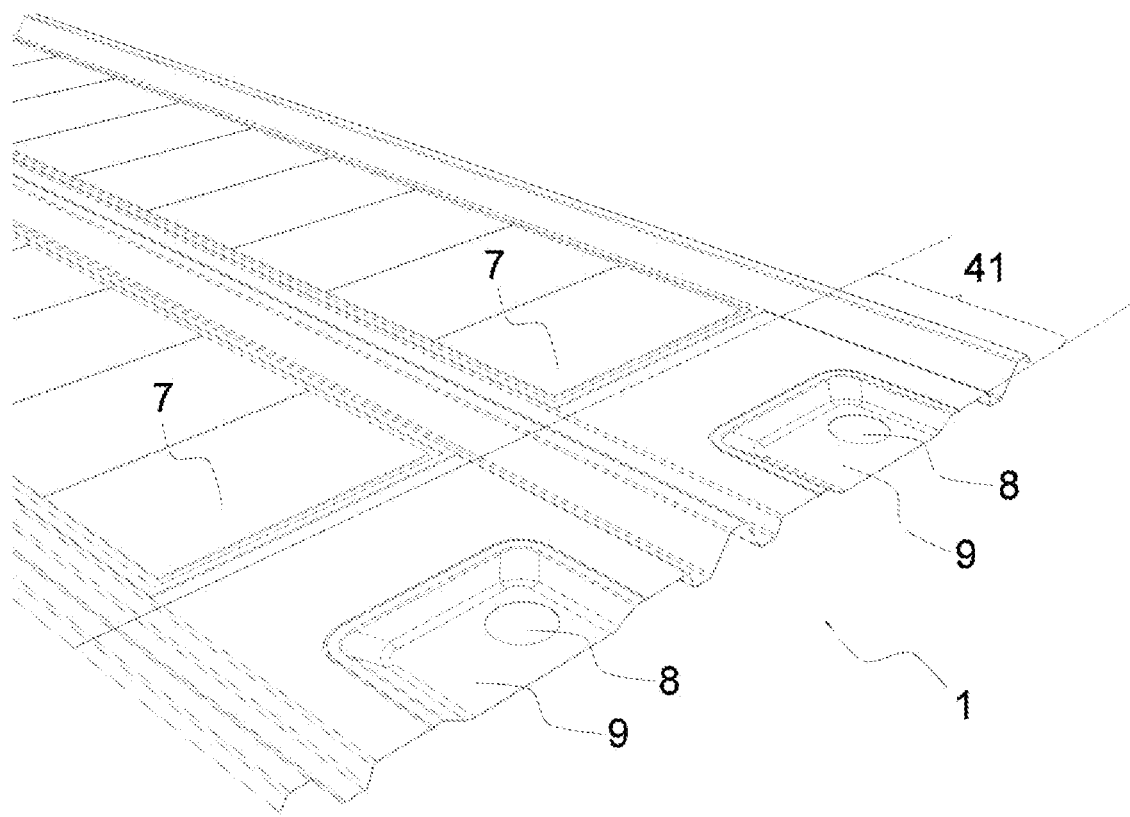
FIG. 2 shows a perspective view of the upper part of the panel of FIG. 1.

With reference to FIG. 2, upper overlap area 41 of panel 1, in certain embodiments, includes an indentation 8, in other words a portion of the panel situated on a level which is below the level of the portion of central part 6 on which columns 7 of photovoltaic modules are placed. In other words, this indentation can be distinguished from the central part 6 by a difference in level. It is visible from the upper surface of panel 1.

This indentation thus allows placement of an electrical connection box, electrical wires and/or conductive strips into the space thus formed between the panel in question and the adjacent panel, which overlaps it in upper overlap area 41. By adjusting the particular dimensions of the indentation, the connection box, the electrical wires and/or the conductive strips, respectively, it is thus possible to jointly cover the upper overlap area 41 with the lower overlap area 51 of the adjacent panel. This improves water-tightness of the assembly of two adjacent panels.

Also to improve water-tightness, indentation 8 does not extend beyond the upper overlap area so that water flowing on the roof does not penetrate into the indentation.

Indentation 8 may be achieved by way of stamping of the panel or by using any other forming method known to the person skilled in the art which is adapted to the situation.

The electric connection box may be affixed to the indentation by any appropriate method such as, for example, glue, an adhesive, or a circumferential flange.

In certain embodiments, the electric connection box may be affixed to the indentation with the aid of an opening 9 formed in the indentation. Such an opening makes it possible to embed one of the two shells of the electrical connection box. This is advantageous in particular when the space created by the indentation is insufficient for holding the connection box. This opening also makes it possible to more efficiently affix the shell of the connection box on the panel than by only using glue applied between the base of the shell and the panel. The shell may thus be joined with the panel while having the ability to move minimally within the opening in order to facilitate the interlocking of the two shells forming the connection box during the assembly of two adjacent panels. This opening may also make it possible for the shell of the connection box to protrude on the rear side of the panel and thus to connect the shell to an electrical wire or to a conducting strip situated on the rear side.

The dimensions of opening 9 are adapted to the shell of the electrical connection box intended for this purpose. The dimensions are in particular adjusted with a view to thermal expansion, the loads the panel may be subjected to during operation and the desired tolerances in order to facilitate assembly of adjacent panels. If the opening is round, the particular shell also has play to turn minimally within the opening in order to facilitate the interlocking of the two shells forming the connection box during the assembly of two adjacent panels.

To ensure water-tightness, opening 9 does not extend beyond the upper overlap area so that, during roof assembly, it is covered by an upper panel and water flowing on the roof may thus not pass through.

Opening 9 may be obtained by any cutting method known to a person skilled in the art, non-restrictive examples of which are punching, milling, mechanical cutting, laser cutting, waterjet cutting, oxy-fuel cutting.

Figure 3:
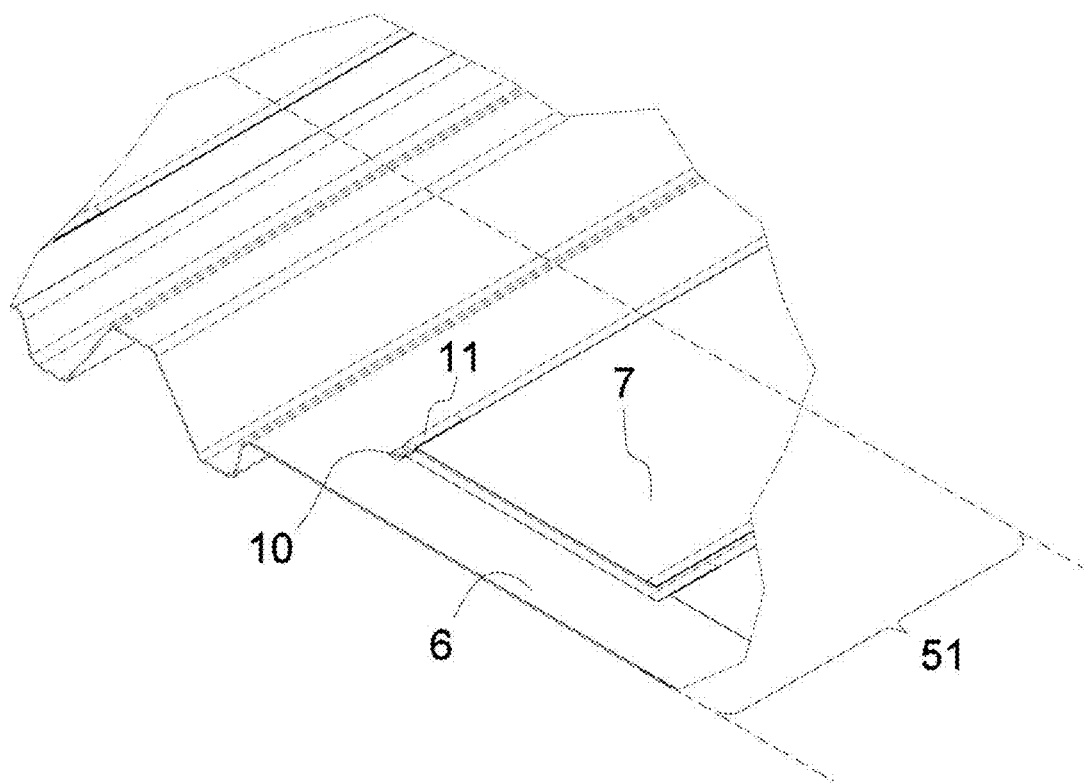
FIG. 3 shows a perspective view of the lower part of the panel of FIG. 1.

With reference to FIG. 3, lower overlap area 51, in certain embodiments, includes a perforation 10, that is, an opening done in the thickness of the panel. Perforation 10 makes it possible to run conducting strip 11 to the rear side of the panel from the cell at the extremity of the photovoltaic module positioned on the panel at the level of the perforation. The position of perforation 10 in lower overlap area 51 also makes it possible to retain water-tightness of the assembly of two adjacent panels. If the water running down the roof were to flow through the perforation due to insufficient water-tightness of the latter, the water would be contained in upper overlap area 41 of the adjacent panel and would continue to run down the roof. For this purpose, the perforation does not extend beyond lower overlap area 51.

In certain embodiments, perforation 10 is situated in central part 6.

Perforation 10 may be obtained by any cutting method known to a person skilled in the art, non-restrictive examples of which are punching, milling, mechanical cutting, laser cutting, waterjet cutting, oxy-fuel cutting, or drilling.

In certain embodiments, Panel 1 does not include any opening in the thickness of the panel outside of upper overlap area 41 and lower overlap area 51 in order to ensure water-tightness of the roof.

Figure 4:
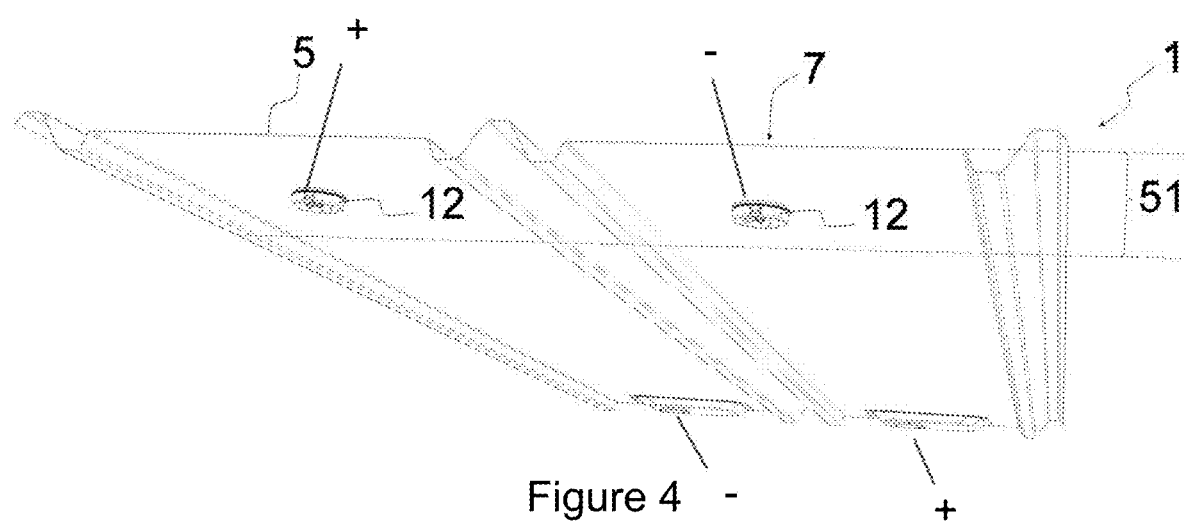
FIG. 4 shows a perspective view of the rear side of the lower part of a panel of an exterior cladding of a building equipped with at least one photovoltaic module.
Figure 5:
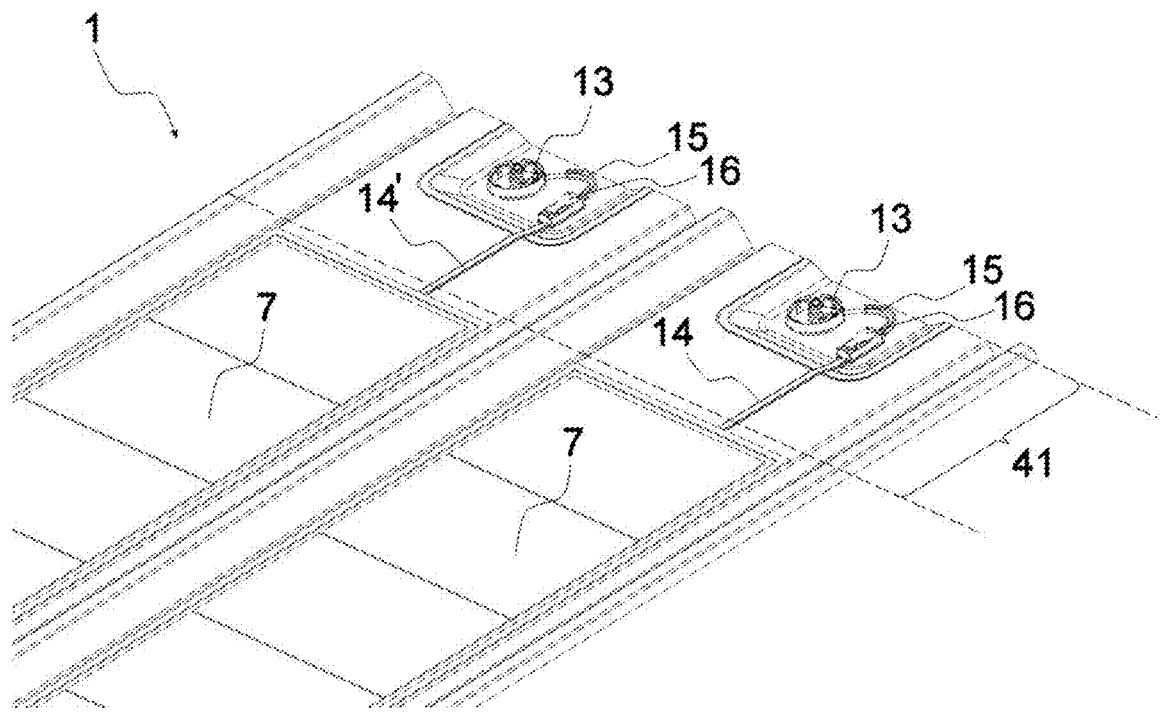
FIG. 5 shows a perspective view of the upper part of a panel of an exterior cladding of a building equipped with at least one photovoltaic module.

With reference to FIGS. 4 and 5, a panel 1 is shown equipped with connection box shells according to a first embodiment.

With reference to FIG. 4, panel 1 includes a first shell 12 of a connection box positioned on the rear side of the panel in lower overlap area 51. This shell is connected to column 7 of photovoltaic modules via the conducting strip which is connected to the photovoltaic cell of the lower extremity of the lower module of the column and which runs along panel 1 through perforation 10.

In certain embodiments, first shell 12 is positioned plumb with perforation 10 in order to minimize the amount of conducting strip required for the electrical wiring and to facilitate the sealing of the perforation.

With reference to FIG. 5, panel 1 includes a second shell 13 of a connection box positioned in the indentation formed on panel 1 in upper overlap area 41 on the front side of the panel. The second shell is connected to a column 7 of photovoltaic modules and in particular to its electrical pole 14 (or 14') situated at its upper extremity, in certain embodiments, via an electrical wire 15 and a junction box 16.

Junction box 16 includes a watertight casing suitable for electrically connecting a conducting strip to an electrical wire. If this embodiment is chosen, the junction box connects conducting strip 14 (or 14'), acting as upper electrical pole of column 7 of the photovoltaic modules, to electrical wire 15, which in turn is connected to the second shell. Use of this junction box and an electrical wire improves the resistance of the electrical connections to different thermal expansions between the different components of the panel according to the invention. The conducting strips of the electrical poles are in fact sensitive to differences in thermal expansions, which may cause them to break.

The two shells are positioned on the panel in such a way that they are plumb with one another and may interlock when lower overlap area 51 of a panel is overlapped by upper overlap area 41 of a longitudinally adjacent panel. In other words, the two shells are positioned at the same distance towards first longitudinal edge 2 and the distance between the first shell and lower transverse edge 5 of the panel is identical to the distance between the second shell and the lower edge of upper overlap area 41. In certain embodiments, the two shells are positioned so that they interlock when the lower overlap area 51 of a panel longitudinally fits over the upper overlap area 41 of an adjacent panel, by alignment along an axis perpendicular to the plane in which the adjacent panel rests. This facilitates assembly of the panels on the building structure.

According to a first embodiment, each column 7 of photovoltaic modules of the panel is connected to a first shell 12 by the conducting strip acting as lower electrical pole of the column and, on the other hand, to a second shell 13 by the conducting strip acting as upper electrical pole of the column, in certain embodiments via an electrical wire 15 and a junction box 16.

According to a second embodiment of panel 1 equipped with connection box shells, first shell 12 is positioned in indentation 8 and is directly connected to the conducting strip connected to the photovoltaic cell of the upper extremity of the module. Second shell 13 is positioned on the rear side of the panel in lower overlap area 51 and is in turn connected to the lower electrical pole of column 7 of photovoltaic modules via an electrical wire 15 and a junction box 16.

The two shells are positioned on the panel in such a way that they are plumb with one another and interlock when lower overlap area 51 of a panel is overlapped by upper overlap area 41 of a longitudinally adjacent panel. In other words, the two shells are positioned at the same distance from first longitudinal edge 2, and the distance between the second shell and lower transverse edge 5 of the panel is identical to the distance between the first shell and the lower edge of upper overlap area 41. In certain embodiments, the two shells are positioned so that they interlock when the lower overlap area 51 of a panel longitudinally fits over the upper overlap area 41 of an adjacent panel, by alignment along an axis perpendicular to the plane in which the adjacent panel rests. This facilitates assembly of the panels on the building structure.

According to the second embodiment, each column 7 of photovoltaic modules of the panel is connected, on the one hand, to a first shell 12 by the conducting strip acting as upper electrical pole of the column and, on the other hand, to a second shell 13 by the conducting strip acting as lower electrical pole of the column, in certain embodiments, via an electrical wire 15 and a junction box 16.

The panel according to the second embodiment includes all characteristics of the panel according to the first embodiment with the exception of the characteristics described above.

With reference to FIGS. 6 to 9, the connection box according to the first embodiment is described.

The connection box includes firstly a first shell 12 (shown in FIGS. 6, 6A and 7) and a second shell 13 (shown in FIGS. 8 and 9), which are interlockable.

Interlockable is understood to mean that a part of one of the two shells may insert into a part of the other shell when the two shells approach one another on a predetermined axis.

The two shells are designed in such a way that their interlocking delimits a watertight and dustproof internal cavity during operation of the box on the photovoltaic roof, in other words, once the electrical wires and the conducting strips required for the electrical connection of the panel according to the invention have been connected to the two shells.

Figure 6:
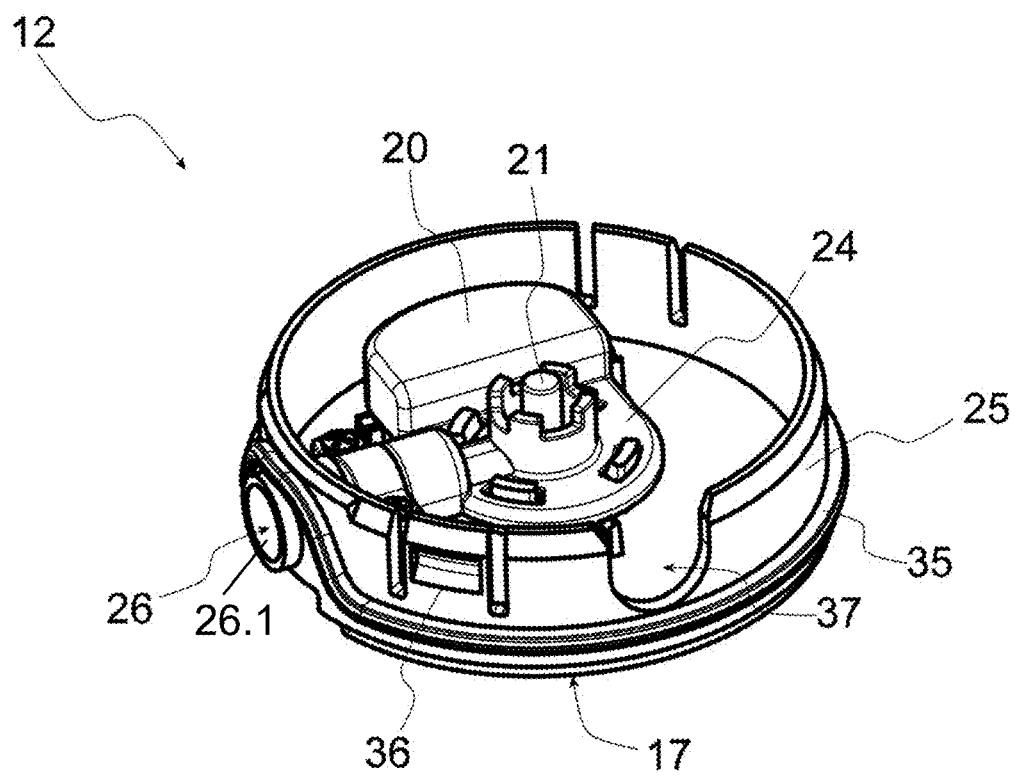
FIG. 6 shows a perspective view of a first connection box shell according to one embodiment.
Figure 6A:
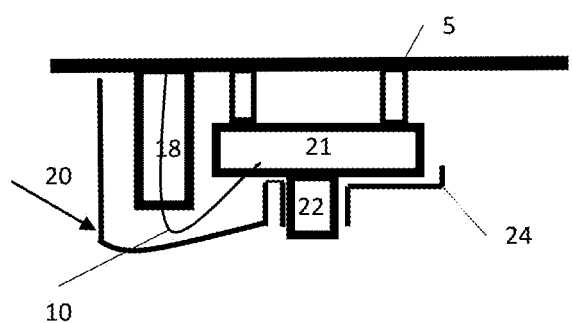
FIG. 6A shows a schematic cross-section view of the first connection box shell of FIG. 6.
Figure 7:
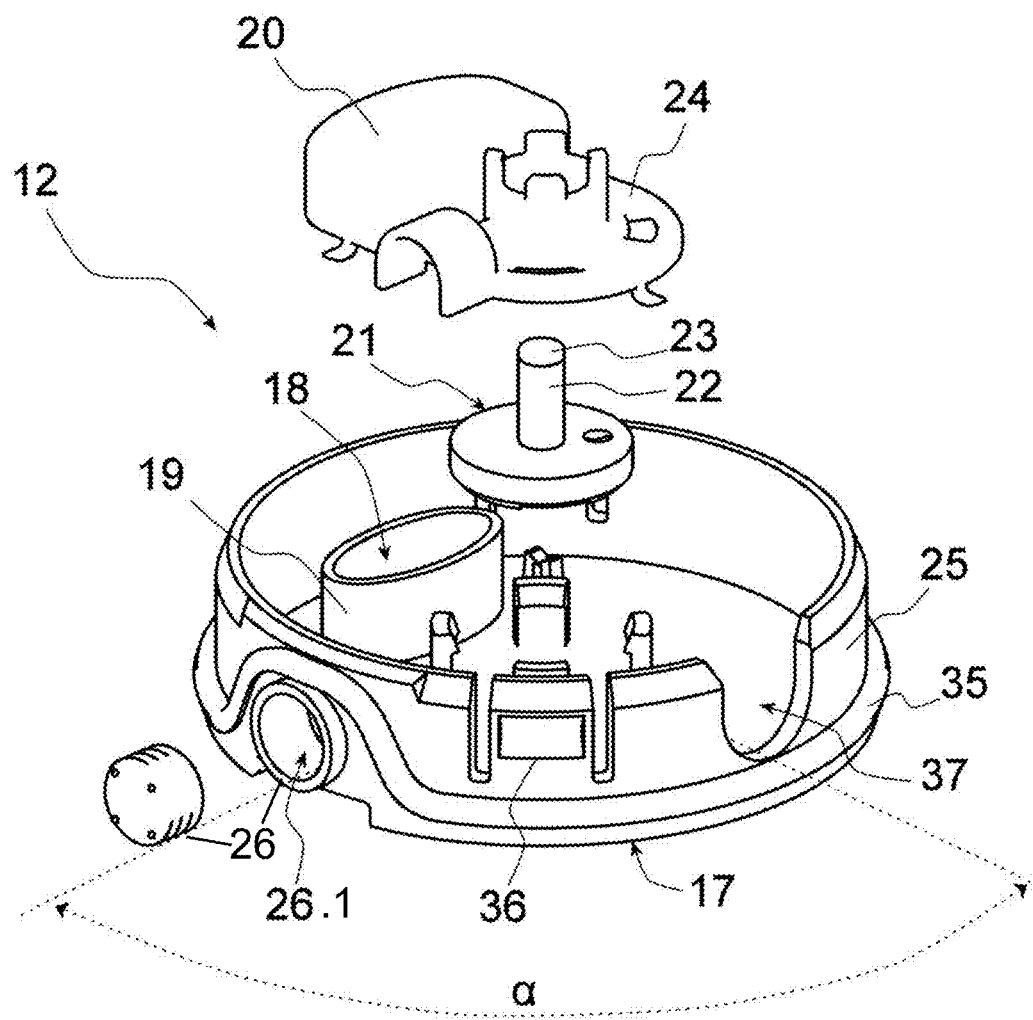
FIG. 7 shows an exploded perspective view of the first shell of FIG. 6.

With reference to FIGS. 6, 6A, and 7, first shell 12 includes firstly a base 17 including an aperture 18 topped by a sealing chamber 19.

In certain embodiments, base 17 of the first shell is substantially flat in order to facilitate fixation of this shell on the panel and/or to minimize obstruction of the connection box to allow its proper insertion in the overlapping area between two adjacent panels of exterior cladding. In some of these embodiments, it is completely flat. Alternatively, it may include a protrusion which enables the passage beneath the base of a conducting strip which runs along the surface of the panel. This protrusion extends along the outside of the base up to aperture 18 formed in the base.

In certain embodiments, aperture 18 resembles a through-cut groove into the thickness of the base. This makes it possible to pass a conducting strip acting as an electrical pole of a column 7 of the photovoltaic modules into first shell 12. Its dimensions are therefore adapted to the cross-section of the conducting strip acting as the electrical pole of the photovoltaic module.

In certain embodiments, base 17 includes no opening other than aperture 18 in order to achieve good watertightness of the connection box.

Aperture 18 is topped by a sealing chamber 19 intended to facilitate the sealing of the first shell at aperture 18. In certain embodiments, this chamber includes a dividing wall having a closed outline, placed on base 17, extending therefrom and surrounding aperture 18.

The closed outline of the dividing wall makes it possible to fill the space delimited by the dividing wall and the base with an electrically insulating and sealing material such as, for example, silicone.

In certain embodiments, sealing chamber 19 is topped by a lid 20 as shown in FIGS. 6 and 6A. This makes it possible to cover any conducting strip exiting the sealing chamber. Thus, an operator working on a panel equipped with this first shell would not be able to touch this conducting strip which may be live simply due to the fact that the photovoltaic cells of the panel are exposed to light.

The first shell also includes an electrical terminal 21, attached to the base, perpendicular to the base. The electrical terminal 21 is intended to be electrically connected to one of the two electrical poles of a photovoltaic module. It is in particular intended to be electrically connected to the conducting strip, inserted into aperture 18, which acts as electrical pole of a column 7 of photovoltaic modules. In other words, it is intended to be electrically connected to the seal housing 19 above aperture 18. According to one embodiment of the present invention, the conducting strip inserted into aperture 18 is directly connected to the electrical terminal, for example, soldered onto it as illustrated in FIG. 6A. According to another embodiment, electrical terminal 21 includes a conductive contact extending into sealing chamber 19. According to this embodiment, when the first shell is placed on panel 1, the conducting strip inserted through aperture 18 is directly soldered onto this contact inside the sealing chamber.

In certain embodiments, electrical terminal 21 is placed on the base. Alternatively, it is attached to the base via another element of the first shell, such as, for example, its lateral wall.

In certain embodiments, electrical terminal 21 is centered on the base in order to enable interlocking of the two shells regardless of the angular orientation of the two shells.

In certain embodiments, the electrical terminal includes a cylindrical conductive pin 22 topped by an insulating tip 23 in order to form a male electrical terminal.

In certain embodiments, the electrical terminal is topped by a protective cover 24, the shape of which enables an electrical connection between the two shells of the connection box while keeping an operator from inadvertently touching the conductive pin of the electrical terminal which may be live during the assembly of the panels of the exterior cladding simply due to the fact that the photovoltaic cells are exposed to light. For this purpose, in certain embodiments, the protective cover includes a hole which enables insulating tip 23 to be visible on the surface of the cover. In this way, no conducting part is directly accessible, which prevents an operator from inadvertently touching it.

In certain embodiments, the diameter of insulating tip 23 is identical to that of conductive pin 22, also in the interest of electrical safety.

In certain embodiments, protective cover 24 forms a single piece with lid 20 of the sealing chamber, so that the electrical connector placed between sealing chamber 19 and electrical terminal 21 is inaccessible through the space between the protective cover and the lid.

In certain embodiments, first shell 12 also includes a lateral wall 25 surrounding the base and extending perpendicularly to it.

According to the shown embodiment, lateral wall 25 has a circular cross-section. This shape facilitates interlocking of the two shells of a connection box by giving a degree of additional play. The interlocking during assembly of two adjacent panels of exterior cladding is achieved even if the two panels are not perfectly aligned, in other words, even if the two shells do not have the exact same angular orientation. Within the framework of the invention, other cross-sections of the wall are however possible, such as, for example, a rectangular cross-section.

In certain embodiments, the base and the lateral wall are made of an insulating material, for example, by molding a synthetic material, in particular a plastic material.

Lateral wall 25 includes a removable hatch 26 as a wire passage 26.1. This hatch is a part of the lateral wall and is removable from the rest of the lateral wall. It is intended to be removed when the first shell is used to electrically connect the electrical pole of a column of photovoltaic modules to an adjacent column or to the electrical converter, this application requiring the insertion into the first shell of an electrical wire in order to electrically connect electrical terminal 21 of the first shell to the adjacent column or to the electrical converter. This application is described below.

According to an embodiment of the present invention, removable hatch 26 is delimited by an area of the lateral wall having a thinner thickness than the rest of the wall. It is therefore simple for an operator to cut open the area of thinner thickness with a knife and to make an electrical wire enter into the interior of the first shell.

According to another embodiment of the present invention, removable hatch 26 is a sealing plug positioned inside an opening in the thickness of the lateral wall. It is therefore simple for an operator to remove the plug and to make an electrical wire enter into the interior of the first shell.

According to another embodiment of the present invention, removable hatch 26 is a cover held in place by screws. It is therefore simple for an operator to unscrew the screws, detach the cover and to make an electrical wire enter into the interior of the first shell.

According to another embodiment of the present invention, removable hatch 26 is a cap glued onto an opening in the thickness of the lateral wall. It is therefore simple for an operator to remove the cap and to lay an electrical wire into the inside of the first shell.

Figure 8:
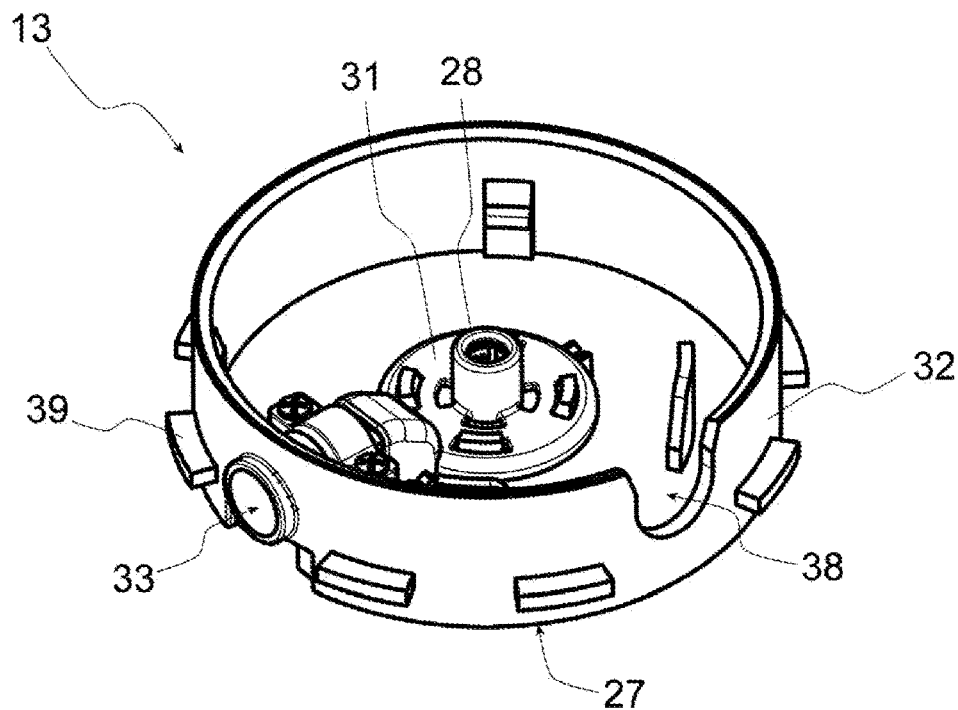
FIG. 8 shows a perspective view of a second connection box shell according to one embodiment.
Figure 9:
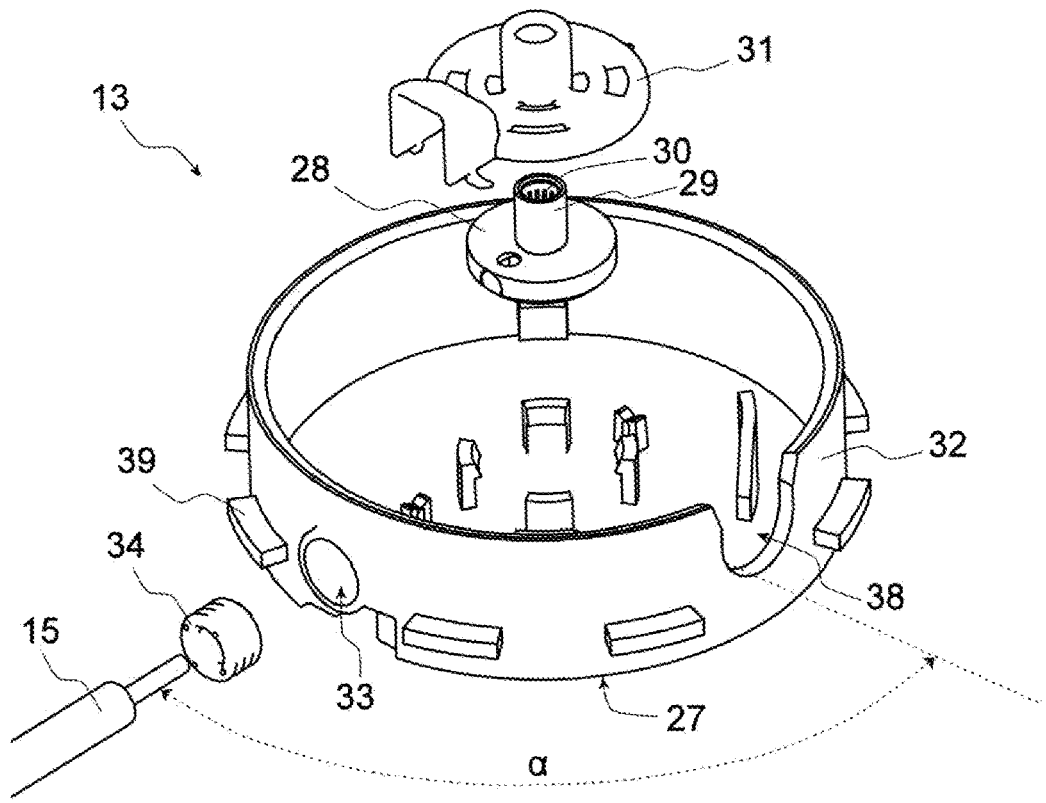
FIG. 9 shows an exploded perspective view of the first shell of FIG. 8.

With reference to FIGS. 8 and 9, second shell 13 includes firstly a base 27.

In certain embodiments, base 27 of this second shell is substantially flat in order to facilitate fixation of this shell on the panel and/or to minimize obstruction of the connection box in order to allow its effortless insertion in the overlapping area between two adjacent panels of exterior cladding. In certain embodiments, it is completely flat.

In certain embodiments, base 27 includes no opening in order to ensure the sealing of the connection box.

Second shell 13 also includes an electrical terminal 28, connected at the base, perpendicular to the base. It is intended to be electrically connected to one of the two electrical poles of a photovoltaic module. In certain embodiments, electrical terminal 28 is placed on the base. Alternatively, it is connected to the base via another element of the second shell, such as, for example, its lateral wall.

In certain embodiments, electrical terminal 28 is centered on the base in order to enable interlocking of the two shells regardless of the angular orientation of the two shells.

In certain embodiments, electrical terminal 28 includes a vertical tube 29 and conductive strips 30 placed along the inner wall of the tube and extending along the axis of the tube in order to form a female electrical terminal. The diameter of the tube, the position of the strips and their shape are adapted to allow the insertion of the conductive pin 22 of the first shell into the tube during interlocking of the two shells and to ensure good electrical contact between the strips and the conductive pin.

In certain embodiments, electrical terminal 28 is topped by a protective cover 31, the shape of which enables an electrical connection between the two shells of the connection box while preventing an operator from being able to inadvertently touch the conductive strips of the electrical terminal which may be live during the assembly of the panels of the exterior cladding simply due to the fact that the photovoltaic cells are exposed to light. For this purpose, In certain embodiments, the protective cover includes a hole which allows the top of tube 29 of the electrical terminal to be plumb with this hole but positioned under the surface of the cover. In this way, no conducting part is directly accessible, which prevents an operator from inadvertently touching it.

Second shell 13 also includes a lateral wall 32 surrounding base 27 and extending perpendicularly to it.

According to the embodiment shown, lateral wall 32 has a circular cross-section. This shape facilitates interlocking of the two shells of a connection box by giving a degree of additional play. The interlocking during assembly of two adjacent panels of exterior cladding is achieved even if the two panels are not perfectly aligned, in other words, even if the two shells do not have the exact same angular orientation. Within the framework of the invention, other cross-sections of the wall are however possible, such as, for example, a rectangular cross-section. Nevertheless, it is understood that lateral wall 32 is of a shape which is compatible with the shape of lateral wall 25 of the first shell at least in the parts of the lateral walls intended to interlock.

In certain embodiments, The base and the lateral wall are made of an insulating material, for example, by molding a synthetic material, in particular a plastic material.

Lateral wall 32 includes a wire passage 33 intended for electrical wire 15 to be inserted into shell 13. Such a wire allows electrical terminal 28 to be connected to a conducting strip acting as electrical pole of a column 7 of photovoltaic modules, notably with the aid of a junction box 16.

In certain embodiments, the wire passage is a hole formed in the thickness of the wall. In certain embodiments, the wire passage is round and has a diameter which is suitable for the passage of an electrical wire.

In order to ensure good sealing, the wire passage may be equipped with an O-ring seal 34 compressed between wire 15 and the wire passage.

According to one embodiment of the connection box, the male and female electrical terminals are inverted between shells 12 and 13. In certain embodiments, shell 12 thus includes a vertical tube 29 and conductive strips 30 placed along the inner wall of the tube and extending along the axis of the tube while shell 13 includes a cylindrical conductive pin 22 topped by an insulating tip 23. Protective covers 24 and 31 are therefore adjusted.

Figure 10:
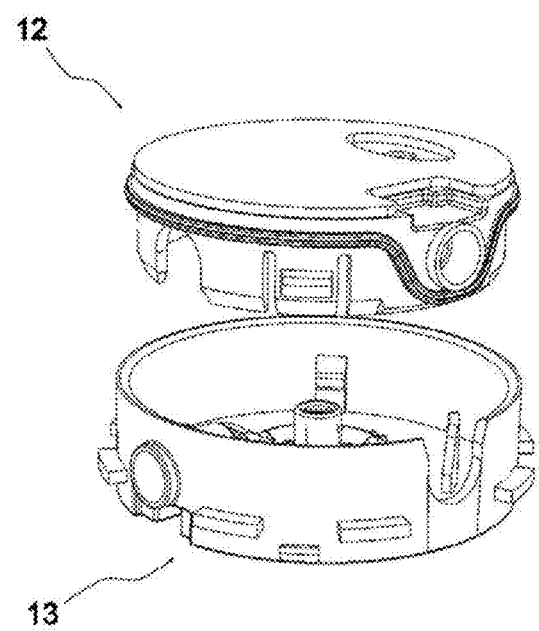
FIG. 10 shows a perspective view of the interlocking of a first shell with a second connection box shell according to one embodiment.

The two shells are designed to interlock one inside the other as shown in FIG. 10.

In certain embodiments, one interlocks into the other at least at the upper extremity of their lateral walls.

According to one embodiment of the invention, shown in FIGS. 6 to 9, the perimeter of lateral wall 25 of first shell 12 is smaller than the perimeter of lateral wall 27 of second shell 13 so that lateral wall 25 at least partially inserts into the second shell, by moving in parallel to the inner surface of lateral wall 27 of that shell. This embodiment is preferred when the second shell is positioned inside indentation 8. In this way, if water were to be present in the indentation at the level of the second shell it would not be able to rise through capillary action between the lateral wall of the first shell and the lateral wall of the second shell.

According to that embodiment, lateral wall 25 may include a peripheral seal 35 situated on its external surface. The position of the seal is adjusted as a function of the depth of the insertion of lateral wall 25 in the second shell. When interlocking the two shells, the seal is compressed and ensures the tightness of the connection box seal.

According to that embodiment, lateral wall 25 may also include mounting clips 36 intended to fix the first shell inside the second shell when the two shells are interlocked. These clips may be in the form of a latch formed by the wall with two vertical notches which are parallel to each other. The external surface of the latch includes a protrusion, respectively a notch, complementary to a notch, respectively a protrusion, on the inner surface of lateral wall 32 of the second shell.

According to another embodiment of the present invention, the perimeter of lateral wall 25 of first shell 12 is larger than the perimeter of lateral wall 32 of second shell 13 so that lateral wall 32 at least partially inserts into the first shell, by moving in parallel to the inner surface of lateral wall 25 of that shell.

According to that another embodiment, peripheral seal 35 is then positioned on the external surface of lateral wall 32 of the second shell. Likewise, mounting clips 36 are then positioned on lateral wall 32 of the second shell.

For these two embodiments, if it is desired that the lateral wall of one of the shells largely inserts into the other shell, it may be necessary to create some cutaways in the lateral wall of the shells so that removable hatch 26 of the first shell is not obstructed by lateral wall 32 of the second shell and/or that lateral wall 25 of the first shell does not push against wire passage 33 of the second shell.

For this purpose, as is also shown as an example in FIGS. 6 to 9, lateral wall 25 of the first shell includes a cutaway 37 and lateral wall 32 of the second shell includes a cutaway 38.

The particular position and size of cutaways 37 and 38 is adjusted so that, during interlocking of the two shells, cutaway 37 of lateral wall 25 of the first shell surrounds wire passage 33 of the second shell while cutaway 38 of lateral wall 32 of the second shell surrounds removable hatch 26 of the first shell.

For this purpose, cutaway 37 of lateral wall 25 and removable hatch 26 of the first shell are offset angularly by an angle α while wire passage 33 and cutaway 38 of the second shell are offset angularly by the same angle α. Electrical terminals 21 and 28 of the two shells are then positioned in such a way that they are plumb with one another when removable hatch 26 of the first shell is plumb with cutaway 38 of the second shell.

The value of angle α is set on a case-by-case basis as a function of, in particular, the position of electrical wire 15, which connects second shell 13 to the conducting strip acting as an electrical pole of a column 7 of photovoltaic modules, knowing that removable hatch 26 of first shell 12 is, in certain embodiments, oriented towards the ridge in order to facilitate, if necessary, laying the electrical wire connecting electrical terminal 21 of the first shell to the adjacent column or to an electrical converter. In certain embodiments, angle α is between 30° and 150° in order to introduce electrical wire 15 on the side of the second shell, which minimizes obstruction of the assembly formed by the second shell, electrical wire 15 and junction box 16.

Furthermore, cutaway 37 of lateral wall 25 of the first shell has a larger width than the diameter of wire passage 33 of the second shell while cutaway 38 of the second shell has a larger width than removable hatch 26 of the first shell.

In the case of such cutaways, the position of the peripheral seal, situated on the external surface of the shell having a smaller perimeter, is adjusted in order to take the cutaways, the wire passage and the removable hatch into account.

In certain embodiments, in order to ensure a good sealing of the connection box, lateral walls 25 and 32 of the shells do not include any opening other than removable hatch 26, wire passage 33 and possible mounting clips 36 and/or cutaways 37 and 38.

Independently of the two interlocking variants described above, if panel 1 includes an opening 9 in its upper overlapping area, the shell intended to be inserted into the opening may include a peripheral ledge 39 on the external surface of its lateral wall.

Peripheral ledge 39 allows the shell to rest in abutment on the exterior cladding panel when the shell and in particular the lateral wall are inserted into opening 9.

In certain embodiments, peripheral ledge 39 is a bead made of the same material as the lateral wall of the connection box. The ledge may thus be manufactured at the same time as the lateral wall, for example, by molding.

In certain embodiments, peripheral ledge 39 is non-continuous on the periphery of the lateral wall in order to minimize the material used for its manufacture. It is nevertheless possible to provide a continuous peripheral ledge.

The position of the peripheral ledge on the height of the lateral wall may be adjusted on a case-by-case basis. In the case where conducting strip 14 (or 14') acting as upper electrical pole of a column is connected to the first shell, respectively the second shell, inserted into opening 9 through the top surface of panel 1, the peripheral ledge is positioned below removable hatch 26, or below wire passage 33 respectively. Conversely, if conducting strip 14 (or 14') is on the rear side of the panel, the peripheral ledge is positioned above removable hatch 26, or below wire passage 33 respectively.

According to an embodiment of the present invention, the first shell 12 includes two electrical terminals 21 connected to the base and the second shell 13 includes two electrical terminals 28 connected to the base and positioned so that they are plumb with the two electrical terminals 21 of the first shell when the first and second shells are interlocked. Such an arrangement limits the number of connection boxes required for the electrical connection of the panels. Indeed, the two electrical terminals 21 can be electrically connected to the electrical poles of two adjacent columns of photovoltaic modules whereas the two electrical terminals 28 can be electrically connected to the electrical poles of inverse polarity (e.g. 14, 14', FIG. 5) on the two adjacent columns of photovoltaic modules. This arrangement thus requires, for a pair of columns 7 of photovoltaic modules, only one indentation 8 to be made in the upper overlap area 41 and, if necessary, only one opening 9 to be made in the indentation. This simplifies the manufacture of the panel as well as its assembly.

According to this embodiment, the first shell 12 can include two ports 18 and two seal housings 19 so as to independently connect each electrical terminal 21 to one of the two conductive ribbons serving as electrical poles on the two adjacent columns of photovoltaic modules. Alternatively, the two conductive ribbons enter the first shell 12 through a single port 18 which is under a single seal housing 19.

According to this embodiment, the first shell 12 can include two removable hatches 26 used as wire passage 26.1 in its side wall 25 so that each electrical terminal 21 is independently connected to the electrical converter or to an adjacent column of photovoltaic modules. Alternatively, the two wires connecting the two electrical terminals 21 to the electrical converter or to an adjacent column exit the first shell 12 through a single removable hatch 26.

According to this embodiment, the second shell 13 can include two wire passages 33 so as to independently connect each electrical terminal 28 to one of the conductive ribbons serving as electrical poles of inverse polarity on the two adjacent columns of photovoltaic modules. Alternatively, the two electrical wires 15 connecting the electrical terminals 28 to the conductive ribbons are inserted into the second shell 13 through a single wire passage 33.

The panels according to certain embodiments of the present invention are manufactured in the factory. During that process, the connection box shells are affixed to the panels. In particular, the bases 17, 27 are, in certain embodiments, positioned parallel to the plane of the portion of the central part 6 on which rest the columns 7 of photovoltaic modules, so as to minimize the space occupied by the connection box and so as to allow the shells 12, 13 to interlock when the lower overlap area 51 of a panel longitudinally overlaps the upper overlap area 41 of an adjacent panel, by alignment along an axis perpendicular to the plane of the portion of the central part 6 on which rest the columns 7 of the photovoltaic modules of the adjacent panel.

During fabrication thereof, the electrical terminals of the connection box shells are also electrically connected to the conducting strips acting as electrical poles of columns 7 of photovoltaic modules. In particular, one of the conducting strips acting as the electrical pole of a given column is introduced through aperture 18 into first shell 12, then electrically connected to electrical terminal 21, whether directly or via a conductive contact extending from electrical terminal 21 into sealing chamber 19. In certain embodiments, the latter is then filled with insulating material. The conducting strip acting as the electrical pole of inverse polarity of the same column is in turn connected to an electrical wire 15 within junction box 16, electrical wire 15 furthermore being connected to electrical terminal 28 of second shell 13.

The panels are then transported to the site before being assembled as described below. On the one hand, the fabrication of the entire panel in the factory makes it possible to guarantee its quality and proper operation, and on the other hand, the assembly operations on site are minimized thanks to the installation of the exterior cladding of the building and of the photovoltaic assembly in a single step.

In certain embodiments, the panels intended for a given assembly each have a first column 7, each of the poles of which have the same polarity as the corresponding pole of the first column of another panel. The dimensions of the panels and the number of columns of photovoltaic modules of the panels may, however, vary.

On the structure of the building to be covered, a first panel 1 is put in place by fastening means such as screws, nails or even rivets. In certain embodiments, the panel is oriented so that its longitudinal edges run in the direction of the slope. This orientation facilitates the drainage of rainwater on the assembly and preserves its water-tightness.

Then, one or more panels are arranged around the first panel and assembled to one another:
- by marginal overlapping of the transverse edges of adjacent panels to form rows of photovoltaic modules so that each shell 12 or 13 situated at the lower extremity of a column of photovoltaic modules of the upper panel on its rear side interlocks into the other shell 13 or 12 of the connection box situated at the upper extremity of a column of lower panels on its front side.
- and/or by marginal overlapping of the longitudinal edges of adjacent panels to increase the number of rows.

A row of photovoltaic modules is therefore defined as a juxtaposition in the longitudinal direction of columns of photovoltaic modules. Depending on the shape of the structure to be covered and particular constraints such as, for example, the presence of a window, a door or a chimney, the rows of panels may be of variable lengths.

In this way, an assembly of the panels forming a plurality of rows of photovoltaic modules is achieved, all photovoltaic modules of a given row being already electrically connected due to the interlocking of the first and second shells. Due to the fact that each panel is equipped with an even number of columns of photovoltaic modules, the number of rows is even. For example, referring to FIG. 11A, three interconnected panels 1.1, 1.2, 1.3, are shown, each having two columns (7.1 & 7.2, 7.3 & 7.4, and 7.5 & 7.6 respectively). A first row is formed by columns 7.1, 7.3, and 7.5, and a second row formed by columns 7.2, 7.4, and 7.6. The number of photovoltaic modules per row depends on the number of panels adjacent to one another in a given row and may therefore vary from one row to another. In the case of a panel that does not exhibit any marginal overlap of its transverse edges, the row of photovoltaic modules blends with the column of photovoltaic modules.

Each row includes an electrical pole at each of its extremities, the polarity of an electrical pole of one extremity being the inverse of that of the electrical pole of the other extremity and the poles of two adjacent rows being of inverse polarity. In other words, each row includes, at its lower extremity, an electrical pole which merges with the electrical pole of the lower extremity of the first column of this row, and on its upper extremity an electrical pole of inverse polarity that merges with the electrical pole of the upper extremity of the last column of this row. With two adjacent columns of a panel being of inverse polarity, this reversal of polarities is also found at the level of two adjacent rows.

In particular, each row includes one of shells 12 or 13 at one of its extremities and the other shell 13 or 12 at the other extremity, two adjacent rows having the same one of the two shells positioned at the same extremity.

The rows of photovoltaic modules are then electrically connected as described below.

At the bottom of the slope of the assembly, the electrical pole of the lower extremity of the first row is electrically connected to the electrical pole of the lower extremity of the second row, the electrical pole of the lower extremity of the third row is connected electrically to the electrical pole of the lower extremity of the fourth row and so on.

Figure 11:
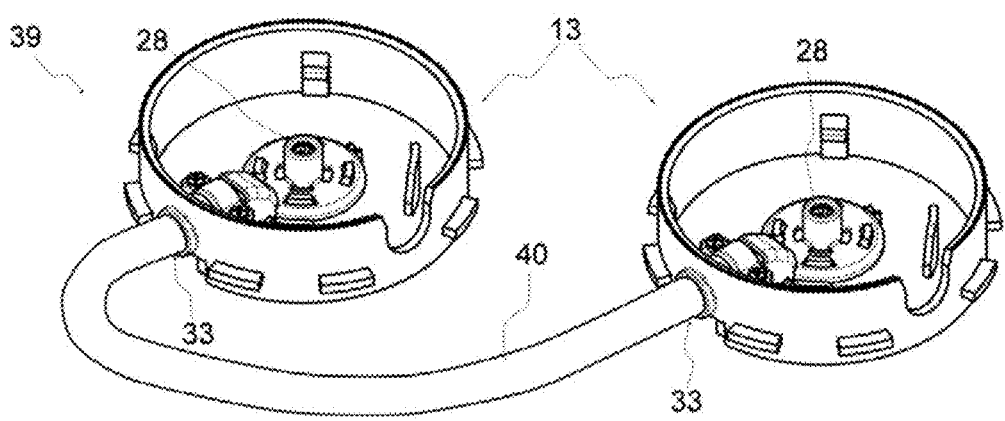
FIG. 11 shows a perspective view of a transverse connector according to one embodiment, FIG. 11A schematically shows a series of three panels with the transverse connector of FIG. 11.
Figure 11A:
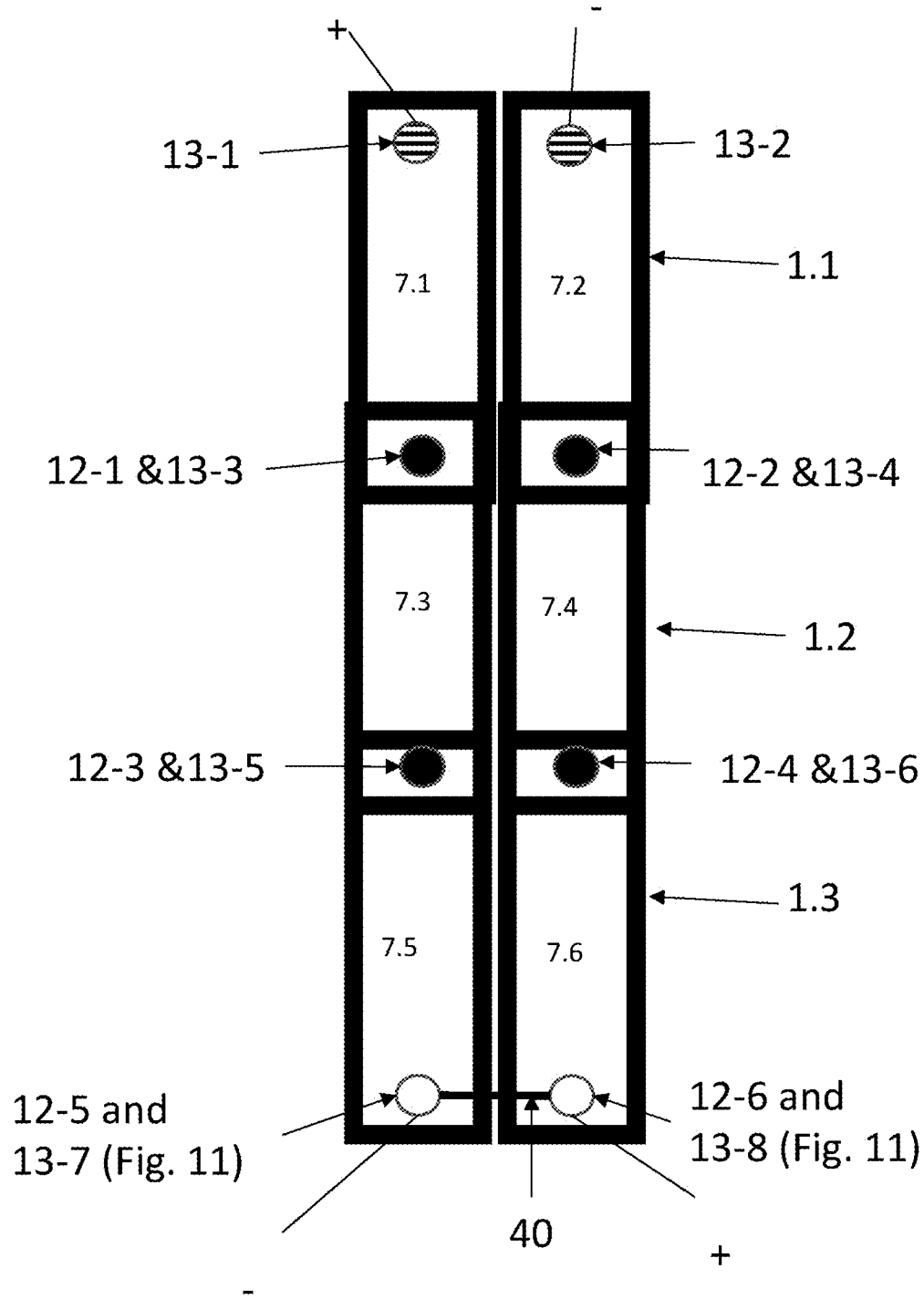
Figure 12:
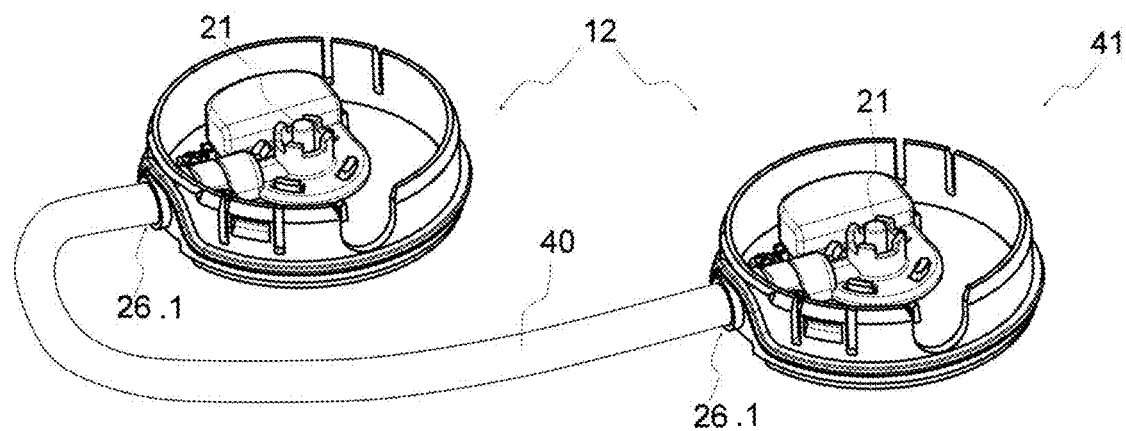
FIG. 12 shows a perspective view of a transverse connector according to another embodiment.
Figure 12A:
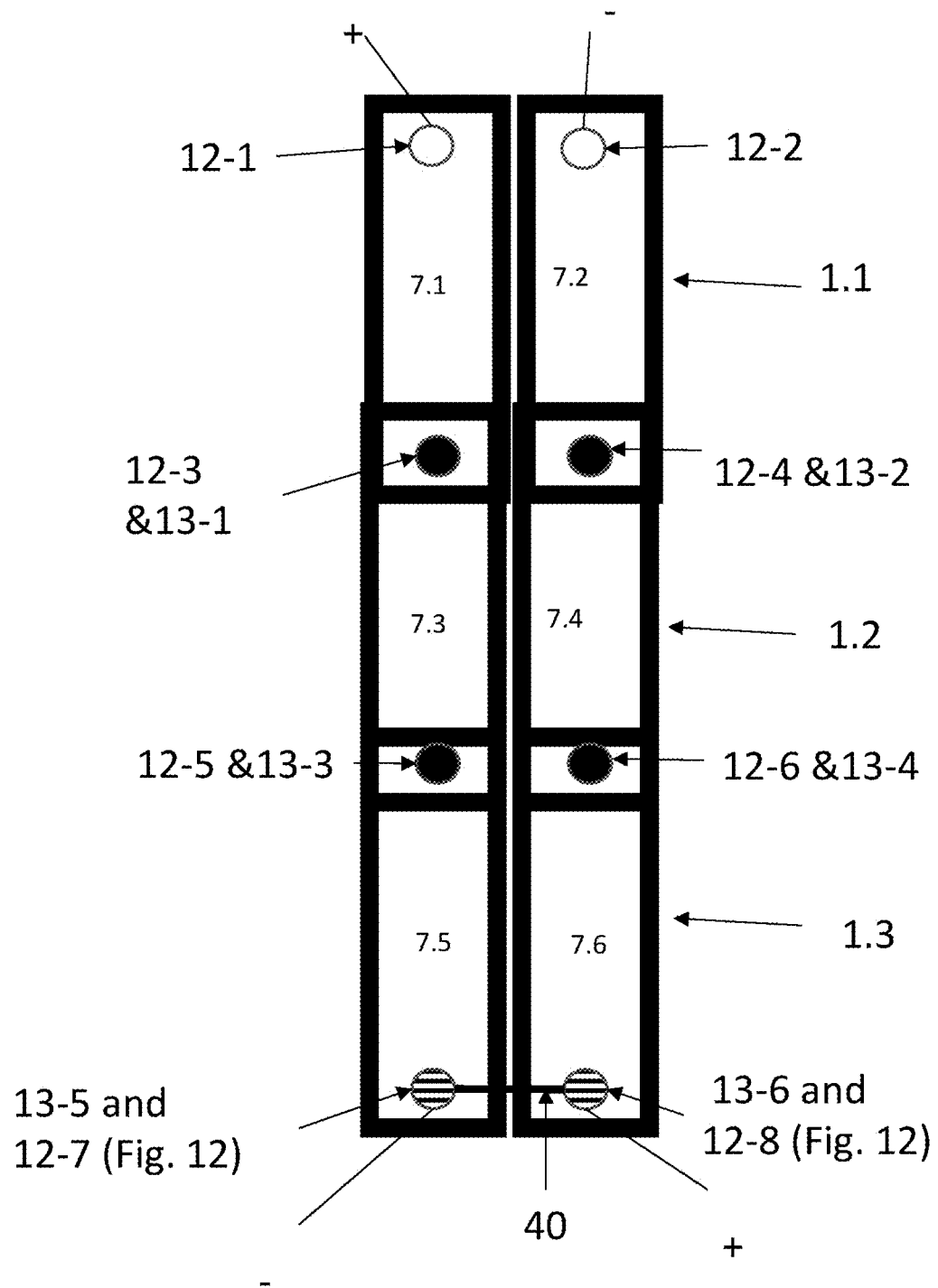
FIG. 12A schematically shows a series of three panels with the transverse connector of FIG. 12.

In particular, referring to FIGS. 11A and 12A, shell 12 or 13 of the lower extremity of the first row is electrically connected to identical shell 12 or 13 of the lower extremity of the second column and so on. For example, in FIG. 11A, shell 12-5 of the first column 7.5 of panel 1.3 is connected to shell 12-6 of the second column 7.6 of panel 1.3. In FIG. 12A, shell 13-5 of the first column 7.5 of panel 1.3 is connected to shell 13-6 of the second column 7.6 of panel 1.3.

In practice, this electrical connection is created with the aid of a transverse connector including two identical shells 12 or 13 connected by an electrical wire. In this way, the electrical connection at the bottom of the slope of the assembly is very simple and limited to the interlocking of two shells 12 or 13 with the shells on the lower extremity of the two adjacent rows.

According to a first embodiment in which first shell 12 is positioned at the lower extremity of the rows, transverse connector 39 includes two shells 13 connected by an electrical wire 40 as shown in FIGS. 11 and 11A, where the two shell 13 of FIG. 11 are shells 13-7 and 13-8 of FIG. 11A. In particular, the electrical wire is inserted into wire passage 33 of each of the shells and electrically connected to electrical terminal 28 of each of the shells.

According to a second embodiment in which second shell 13 is positioned on the lower extremity of the rows, transverse connector 41 includes two shells 12 connected by an electrical wire 40 as shown in FIGS. 12 and 12A, where the two shells 12 of FIG. 12 are shells 12-7 and 12-8 of FIG. 12A. In particular, the electrical wire is inserted into each of the shells through the opening 26.1 in the thickness of the lateral wall after removing removable hatch 26 and electrically connected to electrical terminal 21 of each of the shells.

At the ridge, the electrical poles of the upper extremities of the rows are connected to the converter or to one another in a manner similar to the connection at the bottom of the slope as a function of the acceptable input voltage for the converter. This input voltage is adjusted by adapting the number of columns 7 connected to each other in series. A person skilled in the art will be able to adapt this connection principle to the specific case. According to one possible wiring diagram, the upper electrical pole of the first row is connected to the converter, either directly or not. The upper electrical pole of the second row is connected to the upper electrical pole of the third row with the aid of a transverse connector 39 or 41 similar to those used at the bottom of the slope. The upper electrical pole of the fourth row is connected to the upper electrical pole of the fifth row in the same manner. Finally, the upper electrical pole of the sixth row is connected to the converter. The n photovoltaic modules of the first six rows are thus connected in series and deliver to the converter a voltage equal to n times their nominal voltage. The following columns are then connected using the same method.

In particular, according to a first embodiment in which second shell 13 is positioned on the upper extremity of the rows, two adjacent rows are connected by transverse connector 41, which includes two first shells 12 connected by an electrical wire 40 as shown in FIG. 12. In particular, the electrical wire is inserted into each of the shells through the opening in the thickness of the lateral wall after removal of removable hatch 26 and electrical connection to electrical terminal 21 of each of the shells. The rows connected to the converter are, in turn, via a first shell 12, connected to an electrical wire, which is in turn electrically connected at one of its extremities to electrical terminal 21 of the shell and, at its other extremity, to the converter. This first shell 12 is simply interlocked with second shell 13 positioned at the extremity of the row to be connected to the converter. This greatly facilitates the electrical wiring during assembly of the panels.

According to a second embodiment in which first shell 12 is positioned on the upper extremity of the rows, two adjacent rows are connected by transverse connector 39, which includes two second shells 13 connected by an electrical wire 40 as shown in FIG. 11. In particular, the electrical wire is inserted into wire passage 33 of each of the shells and electrically connected to electrical terminal 28 of each of the shells. The rows connected to the converter are, in turn, via a second shell 13, connected to an electrical wire which is in turn electrically connected at one of its extremities to electrical terminal 28 of the shell and, at its other extremity, to the converter. This second shell 13 is simply interlocked with first shell 12 positioned at the extremity of the row to be connected to the converter. This greatly facilitates the electrical wiring during assembly of the panels.

Therefore, the output of the wires toward the converter is provided at the ridge of the roof, which is easy to access and facilitates their installation or access for repair.

In another embodiment of the assembly of the panels, the manner of connecting the rows of photovoltaic modules at the bottom of the slope and at the ridge of the roof may be reversed so that the wiring output toward the converter is located at the bottom of the slope.

In this way, the two shells 12 and 13 according to certain embodiments of the present invention, which are interlockable, make it possible to implement all electrical connections of the photovoltaic roof by using only those two shells, which allow both to electrically connect two panels to one another, to electrically connect the photovoltaic modules at the bottom of the slope, with each other or to a converter, and to electrically connect the photovoltaic modules at the ridge with each other or to a converter.

What is claimed is:

1. A panel of exterior cladding of a building, the panel comprising:
    an upper transverse edge comprising an upper overlap area intended to be overlapped by a first adjacent panel;
    a lower transverse edge comprising a lower overlap area intended to be overlapped by a second adjacent panel;
    a central part, which connects the upper and lower transverse edges, which is covered by at least one pair of columns of photovoltaic modules, each column including:
        one electrical pole at one of its longitudinal extremities and one electrical pole of inverse polarity at the other extremity, poles of an adjacent column of the at least one pair being of inverse polarity,
        a perforation situated in the lower overlap area through which a conducting strip passes, which connects one of the two electrical poles of the column of photovoltaic modules to one of a first shell and a second shell, the one of the first shell and second shell being situated on a rear side of the panel in the lower overlap area, and
        an indentation situated in the upper overlap area in which the other of the first shell and the second shell is placed, the other of the first and second shell being connected to the other of the two electrical poles of the column of photovoltaic modules;
    the first shell of each column being of a first shell type and including:
        a base comprising one aperture topped by a sealing chamber,
        a lateral wall surrounding the base and extending perpendicularly to it, the lateral wall comprising a removable hatch, removable to expose a wire passage,
        an electrical terminal connected to the base, with an axis perpendicular to the base,
    the second shell of each column being of a second shell type and including:
        a base,
        a lateral wall surrounding the base and extending perpendicularly to it, the lateral wall comprising a wire passage,
        an electrical terminal of inverse polarity to that of the electrical terminal of the first shell, the electrical terminal of the second shell having an axis perpendicular to the base,
    wherein the first shell type and second shell type are interlockable one within the other to form a connection box;

and wherein, on each column, the electrical terminal of the second shell is connected to the base of the second shell and positioned in such a way to be plumb with an electrical terminal of a shell of the first shell type on the first or second adjacent panel when the first or second adjacent panel overlaps the upper or lower transverse edge of the panel and the shell of the first shell type and the second shell are interlocked.

2. The panel of exterior cladding of a building as recited in claim 1, wherein, on each column, the first shell is positioned on the rear side of the panel in the lower overlap area and the second shell is positioned in the indentation.

3. The panel of exterior cladding of a building as recited in claim 2, wherein, on each column, the first shell is positioned plumb with the perforation.

4. The panel of exterior cladding of a building as recited in claim 1, wherein, on each column, the second shell is positioned on the rear side of the panel in the lower overlap area while the first shell is positioned in the indentation.

5. The panel of the exterior cladding of a building as recited in claim 1, wherein, on each column, the second shell is connected to an electrical pole of the column of photovoltaic modules with the aid of an electrical wire and a junction box.

6. The panel of the exterior cladding of a building as recited in claim 1, wherein, on each column, the first and second shells are positioned at the same distance from a first longitudinal edge of the panel and the distance between the first shell and lower transverse edge of the panel is identical to the distance between the second shell and the lower edge of upper overlap area.

7. A roof assembled by marginal overlapping at least two panels as recited in claim 1.

* * * * *